United States Patent [19]

Aun et al.

[11] Patent Number: 5,724,889
[45] Date of Patent: Mar. 10, 1998

[54] STENCIL SHIFTER

[75] Inventors: Lam Cheow Aun; Teik Jin Tan; Ping Chow Teoh, all of Penang, Malaysia

[73] Assignee: Motorola, Inc., Schaumburg, Ill.

[21] Appl. No.: 645,402

[22] Filed: May 13, 1996

[30] Foreign Application Priority Data

Sep. 22, 1995 [MY] Malaysia .................. PI9502827

[51] Int. Cl.$^6$ .................................................. B05C 17/00
[52] U.S. Cl. .................................... 101/127.1; 101/114
[58] Field of Search .................................. 101/114, 123, 101/124, 126, 127, 127.1, 129, 484, 485, 486, DIG. 36

[56] References Cited

U.S. PATENT DOCUMENTS

| | | | |
|---|---|---|---|
| 3,943,851 | 3/1976 | Inada et al. | 101/127.1 |
| 3,945,317 | 3/1976 | Brasa | 101/228 |
| 4,255,226 | 3/1981 | Crofts et al. | 101/127.1 |
| 5,343,802 | 9/1994 | Shimada | 101/35 |
| 5,517,912 | 5/1996 | Winter | 101/114 |
| 5,553,538 | 9/1996 | Freitag | 101/123 |

*Primary Examiner*—Ren Yan
*Attorney, Agent, or Firm*—Frank M. Scutch, III

[57] ABSTRACT

A stencil shifter (800) for positioning a differential thickness stencil stencil (14' integrally formed from two sieves (601 and 602) having different thicknesses (701 and 702) for a two-stage solder printing process for printing the solder mask for a fine-pitch component alongside that of a larger component on the same side of a printed circuit board. This same stencil shifter (800) can also be used for a top and bottom side two-stage printing process. This two-stage printing process uses an integral stencil (814) having a plurality of sieves (801 and 802), the plurality of sieves including at least a first sieve (801) for paste stenciling a first side (191) of a board and a second sieve (802) for paste stenciling a second side (202) of the board. What side the board is facing is first determined by an optical sensor (193) and in response to the side detected, the integral stencil (814) is positioned to locate one of the pluralities of sieves over the board for printing that side.

5 Claims, 13 Drawing Sheets

SECOND SIDE PRINTING

FIRST SIDE PRINTING

HOME POSITION 1

FIG.25

RETAINER MOVE-UP

FIG.26

STENCIL SHIFTED

FIG.27

RETAINER MOVE-DOWN

STENCIL SHIFTER

CROSS REFERENCE TO RELATED APPLICATIONS

This application is related to pending U.S. application Ser. No. 08/645,404 filed May 13, 1996 by Tan, et ah, entitled "A DIFFERENTIAL THICKNESS STENCIL," U.S. application Ser. No. 08/645,403 filed May 13, 1996 by Teoh, et al., entitled "A FLEXIBLE SELF-LEVEL SQUEEGEE BLADE," U.S. application Ser. No. 08/645,405 filed May 13, 1996 by Tan, et al., entitled "A PASTE RETAINER," all related to corresponding applications previously filed in Malaysia, and assigned to Motorola, Inc.

TECHNICAL FIELD

This invention relates in general to Surface Mount Technology (SMT) printers and processes and in particular to efficiently manipulating stencils for printing paste on a substrate.

BACKGROUND

Screen printing on substrates, such as printed circuit boards (PCBs) for Surface Mount Technology (SMT) is well-known.

Figure 1:
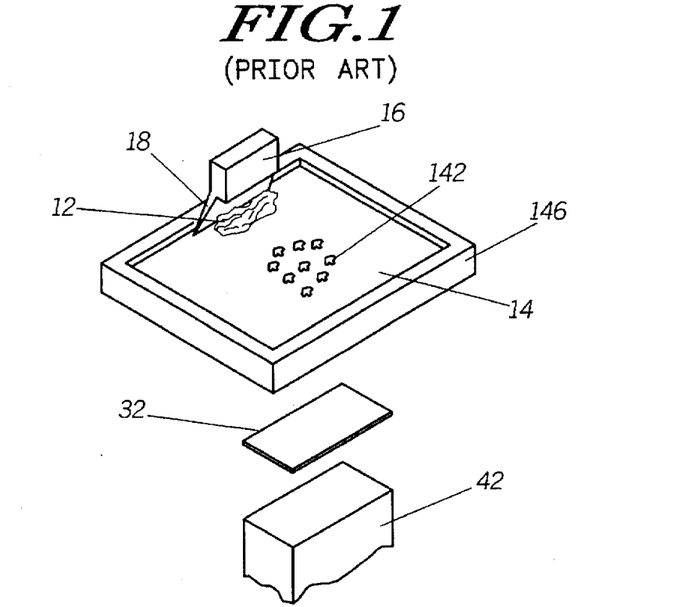
FIG. 1 is a simplified representation of a paste printer.

Referring to FIGS. 1–4, films or pastes of various materials, such as solder, can be deposited by screen or stencil printing. The screen printer is a precision apparatus that provides for mounting or setting-up a screen or stencil 14, positioning the screen relative to a substrate 32 in x, y, and z directions, and a rolling angle, positioning a squeegee 16 with a stencil 18 attached relative to the screen, positioning and moving a substrate conveyor 42 that supports the substrate 32, and moving the squeegee 16 with a controlled speed. The stencil 14 of FIG. 1 is typically constructed of a uniformly stamped stainless steel and etched with a through-hole pattern in the regions in which a paste is to be printed through the etched through-holes or holes 142 of the stencil 14. For reproducible quality printing, the screen or stencil tension and surface must be uniform and held down by an aluminum frame 146.

Figure 2:
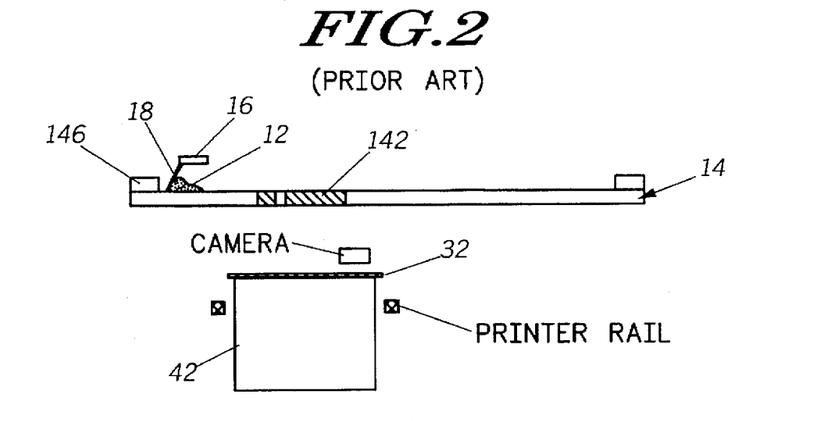
FIGS. 2–4 is a simplified representation of the current paste printing process.
Figure 3:
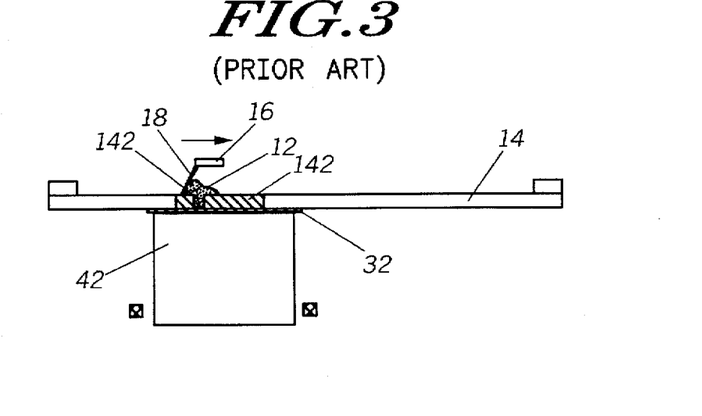

In FIG. 2 showing the current process, a blank printed circuit board 32 is conveyed into proper position over a vacuum tower or nestplate 42 under the stencil 14 by a printer rail with the guidance of a vision camera. After a reservoir of paste 12 is deposited on the stencil 14 by a paste dispenser, the vacuum tower 42 is raised in FIG. 3 to position the supported substrate 32 in direct contact with and below the pattern-marked portion of the stencil 14, such that the pattern portion of the stencil 14 is brought in contact with the substrate 32 in the area under the squeegee 16 stroke and the paste 12 is forced through the through-holes 142 of the stencil 14 by the squeegee blade 18. After the squeegee sweep during which the paste comes in contact with the substrate, the paste wets the substrate, leaving the paste that was in the holes of the stencil deposited on the substrate in the desired pattern.

Figure 4:
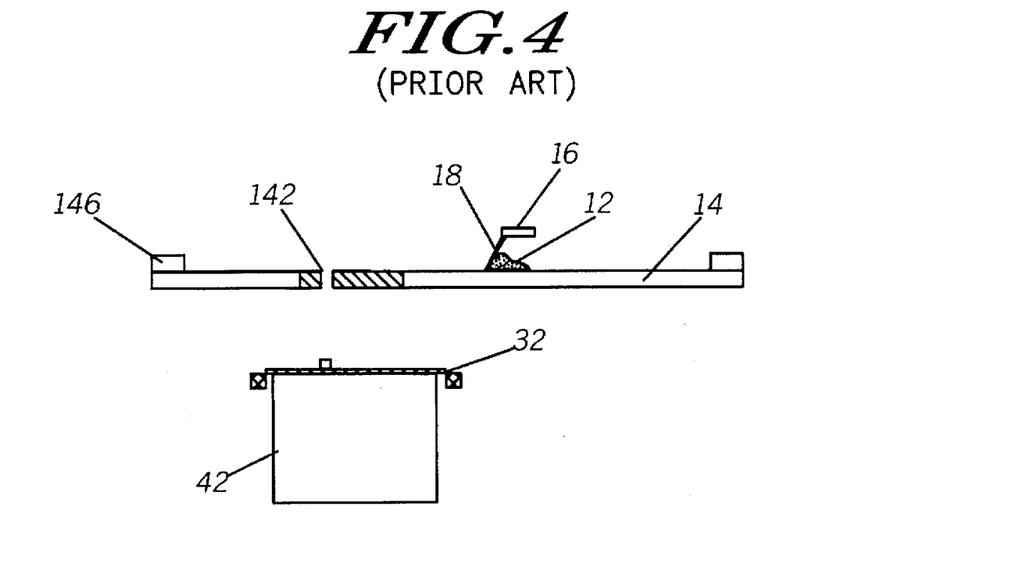

At the end of the printing process, the vacuum tower 42 is lowered in FIG. 4 to re-position the supported substrate 32 back onto the printer rail for the rail to move the printed board 32 to the next assembly sequence stage of the board, such as a pick-and-place machine.

However, as the substrate size and line-width definition of the pattern usually called pitch become smaller, with the advance of microelectronics, controlling the quality of the printing process becomes more complex. The fine pitch printing process is a major roadblock towards miniaturization of PCB assemblies. Many fine pitch printing industries are facing the problem of how to deposit the smaller volume of paste needed for a smaller component (0.5 mm) alongside the bigger volume of paste needed for a bigger component on a single printed circuit board. The quality problems faced includes solder paste smearing and sticking of paste on the underside of the stencil during printing. Hence, the stencil has to be additionally wiped clean after almost every printing cycle to reduce the smear and paste stuck problems. The time required for an operator to change stencils as boards entering the SMT assembly line change, places a significant burden on the overall operation of the line.

The printing problems are even more severe for the ultra-fine pitch components of 0.4 mm and 0.3 mm. Current state-of-the-printing art is almost incapable of printing these 0.3 mm and 0.4 mm extra small components.

Accordingly, a need exists to overcome the problems associated with not only ultra-fine printing but also with the differential deposition of small paste volume for fine pitch components together with a bigger paste volume for bigger components on a single PCB surface in an automated high-speed assembly line.

SUMMARY OF THE INVENTION

Briefly, according to the invention, there is provided a stencil shifter for positioning a mixed-pitch metal stencil integrally formed from two sieves having different thicknesses for a two-stage solder printing process for printing the solder mask for a fine-pitch component alongside that of a larger component on the same side of a printed circuit board. This same stencil shifter can also be used for a top and bottom side two-stage printing process of a double-sided printed circuit board. This two-stage printing process uses an integral stencil having a plurality of sieves, the plurality of sieves including at least a first sieve for paste stenciling a first side of a board and a second sieve for paste stenciling a second side of the board. What side the board is facing is first determined and in response to the side detected, the integral stencil is positioned to locate one of the pluralities of sieves over the board for printing that side.

DETAILED DESCRIPTION OF THE PREFERRED EMBODIMENT

Figure 5:
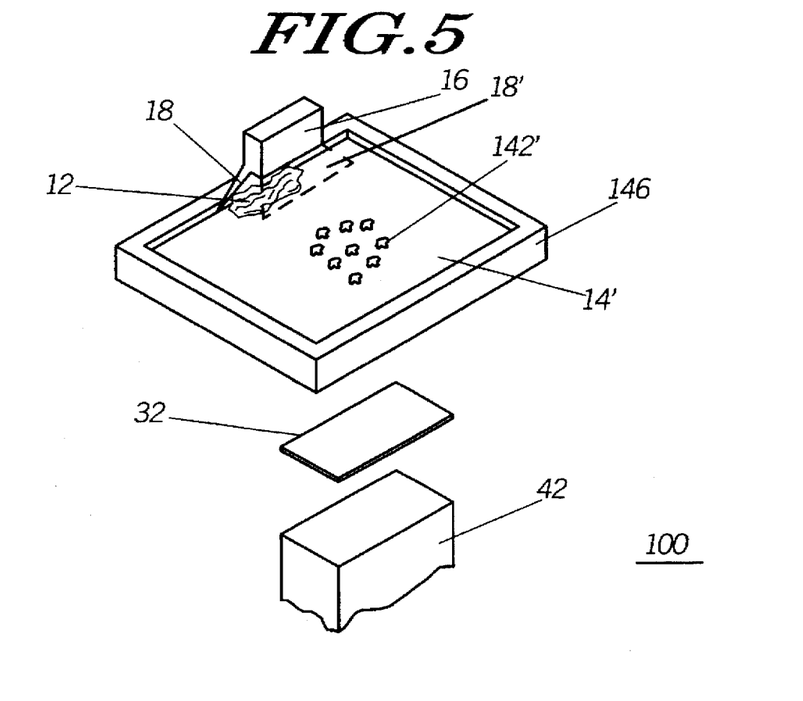
FIG. 5 is a simplified representation of a paste printer in accordance with the present invention.

Referring to FIG. 5, a simplified paste printer 100 is shown for printing solder paste on a substrate, such as a blank printed circuit board (PCB) 32 for later surface placement of electronic components on the solder pasted PCB, as part of the Surface Mount Technology (SMT). A squeegee having a squeegee head 16, with one or two blades 18 and 18', laterally moves, in one or two respective directions, and serves as the movement controller for wiping the squeegee blade 18 or 18' across the stencil 14' covered substrate underneath.

The conventional stencil is made of a solid piece of rigid metal. As the stencil's thickness or height is uniform along its length, the height of paste deposited through the through-holes of the stencil is also uniform. Since the volume of deposited paste has to be governed by an optimized aspect ratio of height to width, the uniform height of paste deposited will also limit the minimum width allowable for the paste volume. Hence, this uniform stencil height does not allow the mixed printing for ultra-fine pitch lines alongside a wider line.

Figure 6:
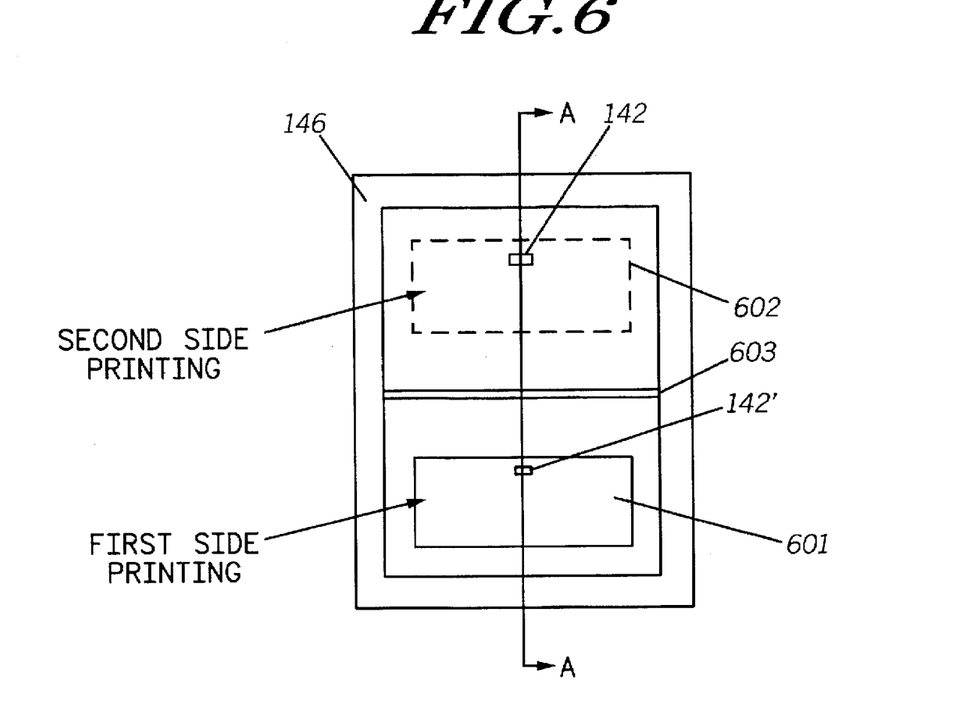
FIG. 6 is a top view of the stencil of FIG. 5.
Figure 7:
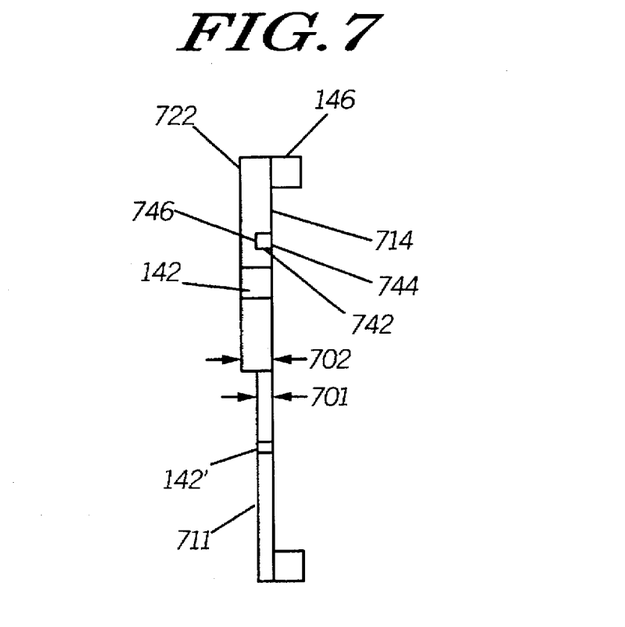
FIG. 7 is a cross-sectional side-view of line A—A of the stencil of FIG. 6.

Referring to FIGS. 5–7, a mixed-pitch metal stencil 14' for printing with a squeegee 16 of a solder paste printer, in accordance with the teachings of the present invention is represented. At least one through-hole 142' having one height 701 is etched on the portion of the metal stencil 504 having the same first height 701 for forming a first sieve or shim 601. Alongside the first sieve 701, at least another through-hole 142 having a second height 702 is etched on a second sieve portion of the metal stencil having the same second height 702 for forming a second sieve or shim 602 to provide for mixed-pitch stencil printing. Thus, two metal shims having different thicknesses are combined in one integral stencil.

The first height or thickness 701 of the first through-hole 142' of the first sieve 601 is measured from a first top surface portion 711 of the stencil to a bottom surface 714 of the stencil. The second height or thickness 702 of the second through-hole 142 of the second sieve 602 is measured from a second top surface portion 722 of the stencil to the some bottom surface 714 of the stencil. However, the second height 702 is higher than the first height 701 to enable the solder deposition through a bigger through-hole 142 as opposed to the smaller through-hole 142' aspect ratio limited by the lower height 701. In addition, the second sieve 602 has at least an inverted well, cavity, or blind-via 742 having an opening 744 on the bottom surface corresponding to the location of the first through-hole 142' of the first sieve 601. This inverted well 742 has a third height between the first and second heights starting from the bottom surface 714 to an underside ceiling 746 of the second top surface 722.

Preferably the first height 701 of the first sieve 601 is between three and four mils for stencil printing the solder mask for the ultra-fine components while the second height 702 of the second sieve 602 is between seven and eight mils for stencil printing the solder mask for the larger components. The blind-via or inverted well of the second sieve 602 preferably measures five mils from the bottom stencil surface 714. However, in actuality these height differences in mils can not be detected by the human eye as seen in FIGS. 8–12 where the width differences of the through-holes and cavities are exaggerated to differentiate between the two sieves. Optionally, if the stencil is separated into more sets of different thickness sieves, more than one PC board can be accommodated at one time.

Figure 8:
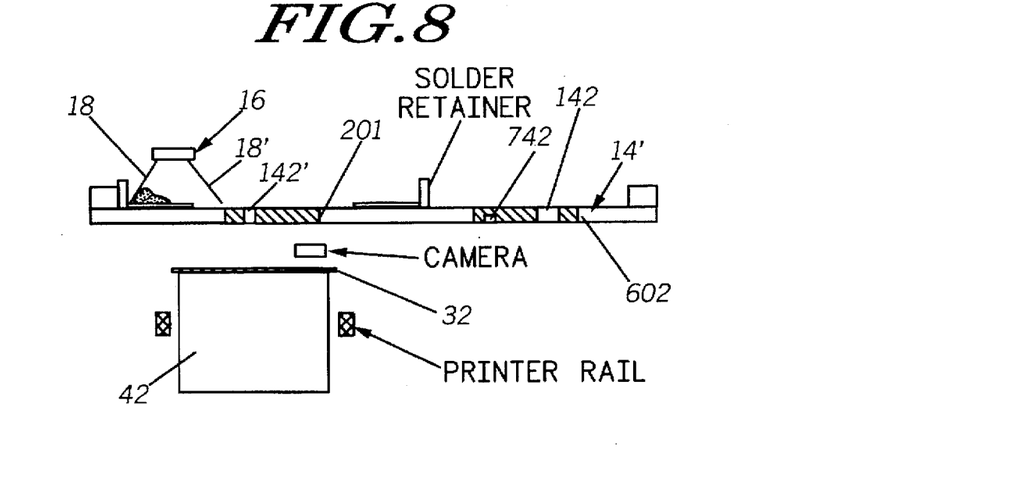
FIGS. 8–12 is a simplified representation of the two-stage paste printing process using the paste printer of FIG. 5, in accordance with the present invention.
Figure 9:
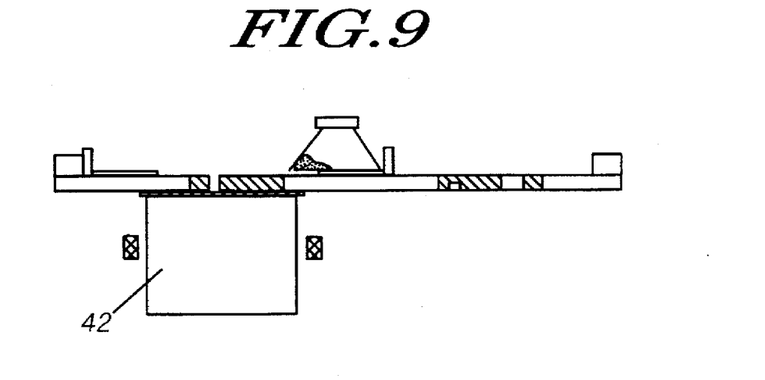
Figure 10:
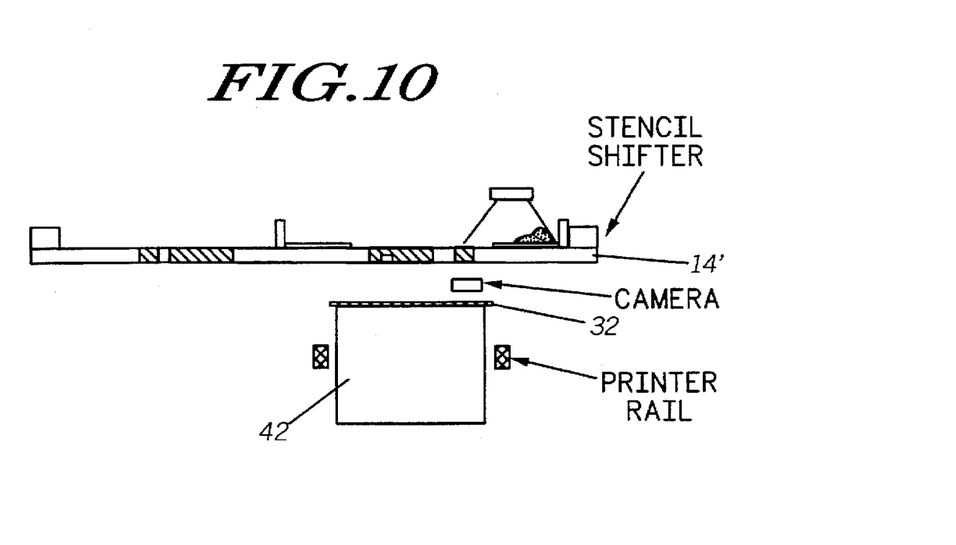
Figure 11:
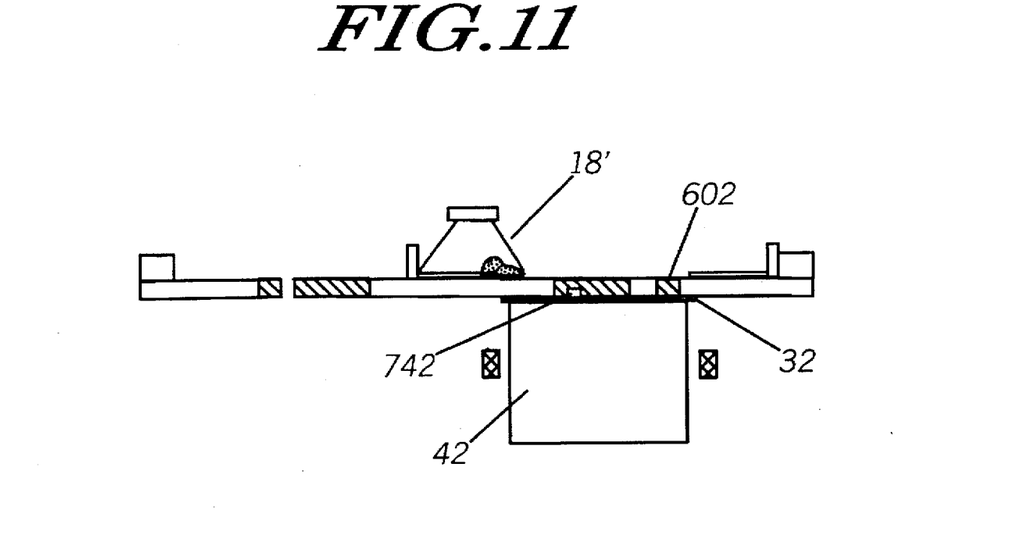
Figure 12:
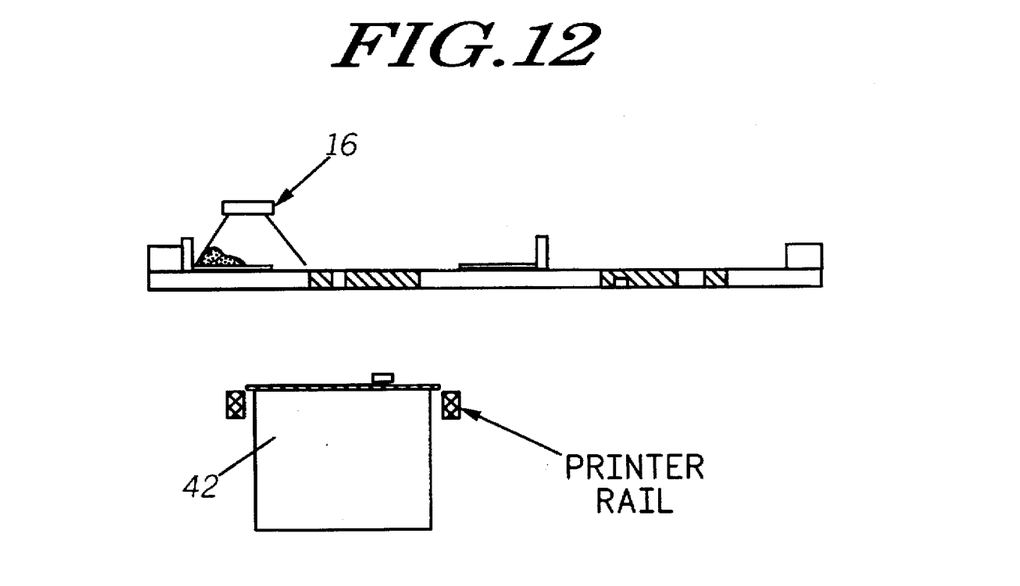

Referring to FIGS. 8–12, a two stage paste printing process advantageously uses the mix-pitch stencil for printing both solder sizes during a single printer rail pass of the printed circuit board. First as seen in FIGS. 8–9, the printer will position the first sieve 601 over the blank substrate or PCB 32 by raising the PCB 32 from the printer rail and using a vacuum tower or nestplate 42 to lift up the PCB 32 to print the solder mask pattern for the ultra fine pitch components by the first squeegee blade 18. After this first printing in FIG. 10, the substrate 32 will be lowered by the vacuum tower 42 or otherwise moved away to make room for the stencil 14' itself to be shifted or otherwise moved by a stencil shifter assembly 800 to a second position. For the second printing of FIG. 11, the second sieve 602 of the stencil is now positioned over the partially printed substrate 32 which is moved upwards toward the stencil for stencil printing the solder mask for the larger components by the second squeegee blade 18'. The selectively positioned five mils blind-vias or cavities 742 from the bottom stencil surface will protect the first printed paste during this second printing. Hence, the second printing will print the mask for the bigger components without smearing the first printing results which are still wet after both printings have been completed as seen in FIG. 12.

Referring to FIGS. 13–21, an automatically controlled stencil shifter assembly 800 is shown. Not only can this stencil shifter assembly 800 be used for interchanging the different sieves of the differential thickness stencil 14' of FIG. 7 in a two-stage printing process of FIGS. 8–12 but it can also be advantageously used, in a uniform or differential thickness stencil 814 for printing the top side 202 of a double-sided PCB 181 and the bottom side of the same or another double-sided PCB board at the next printer rail entry to efficiently speed-up the SMT process. In this manner, one printer will be able to print both top and bottom side of the double-sided board without any mechanical changeover of the stencil.

Of course, depending on how many different sieves for the top and bottom sides of the PCB can be accommodated on the same stencil and how many boards can be supported on a PCB panel, two or more boards on the top side and two or more boards on the bottom side can also be solder paste printed in one single printer rail entry.

Stencil shifter assembly 800 is implemented as an auto-pneumatic control system to shift the stencil 814 front and back for printing a double-sided board. With the differential thickness stencil, the stencil shifter mechanism shifts the differential thickness stencil front 822 and back 811 to achieve the two stages of solder printing on one board. If a top-and bottom-side stencil 814 is used instead of the differential thickness stencil, the stencil shifter mechanism shifts the top-and-bottom side stencil front and back to achieve the top and bottom printing stages on the double-sided board.

Referring to FIGS. 13–17, the stencil shifter assembly 800 is shown as a combination of at least two major parts. A stencil holder carriage frame 860 on the inner portion of the shifter and master frame 850 on the outer portion of the shifter. A rodless cylinder 852 or another type of cylinder or stepper motor controlling linear motion from one end to another end moves the stencil 814 front 822 and back 811 or back 811 and forth 822 held by the stencil holder carriage frame 860 within the stationary master frame reference 850. Two linear guides 854 are mounted on the master frame 850 by respective brackets 856 and 858 used to join the linear guides 854 to the stencil holder frame 860 at both the right (856) and left (858) sides. The purpose of this linear guide 854 is to guide the stencil holder 860 to slide linearly (front and back) as controlled by the rodless cylinder 852. The rodless cylinder 852 is mounted on the side of the left linear guide and another bracket 862 is used to join the rodless cylinder 852 and the left linear guide 854 in order to shift the stencil holder frame 860 front and back.

Figure 13:
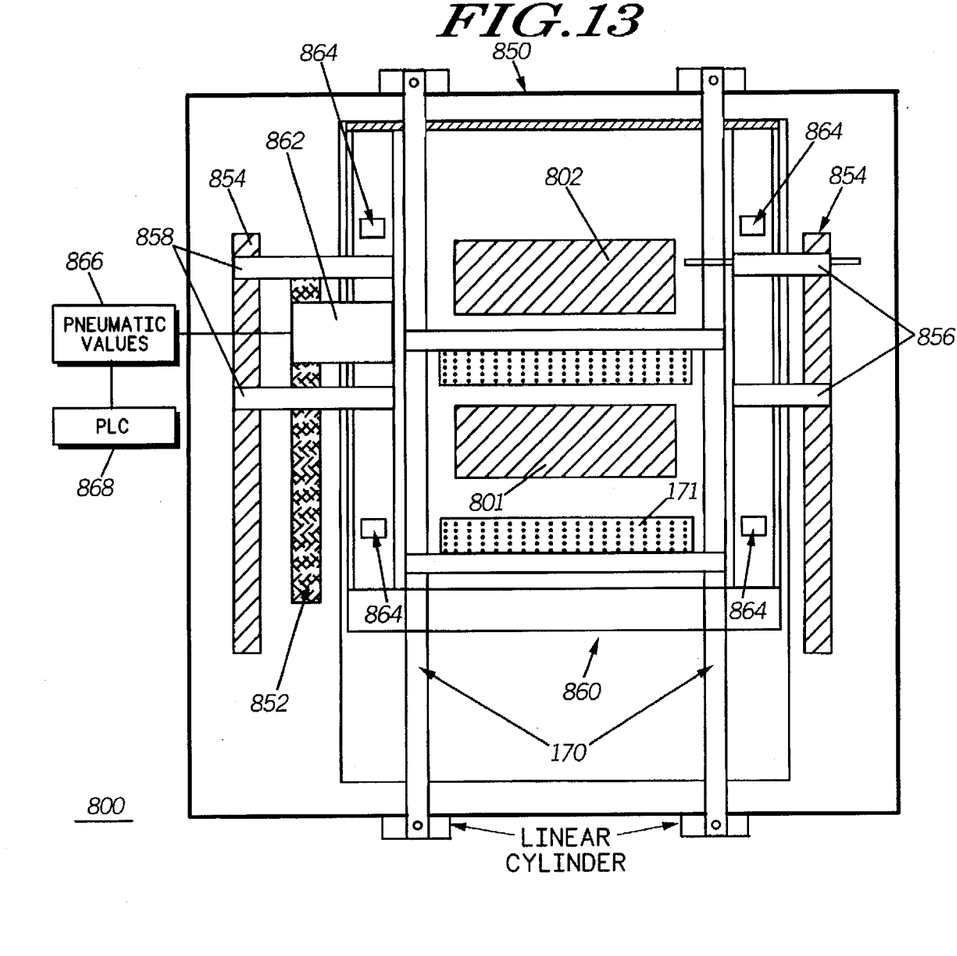
FIG. 13 is a top-view of a stencil shifter assembly, in accordance with the present invention.
Figure 14:
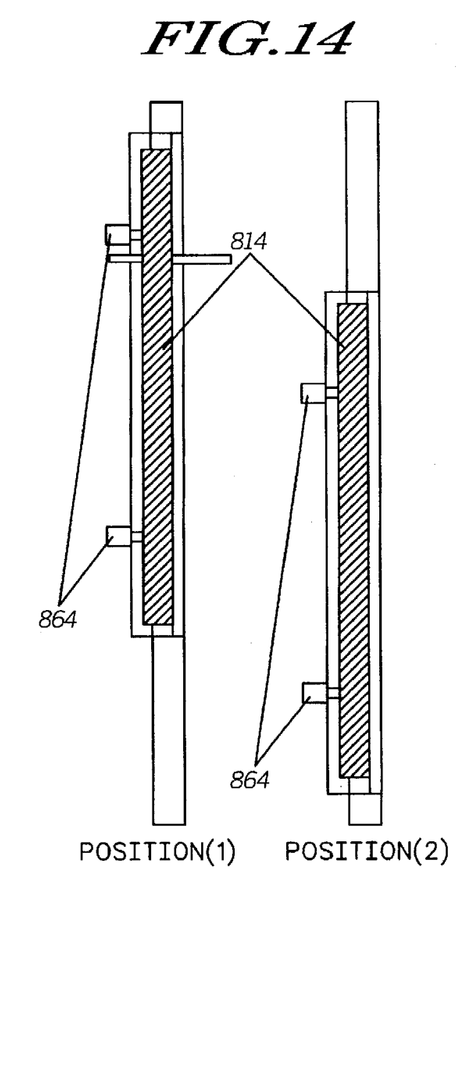
FIG. 14 is a side-view of the shifter mechanism of FIG. 13, in accordance with the present invention.
Figure 15:
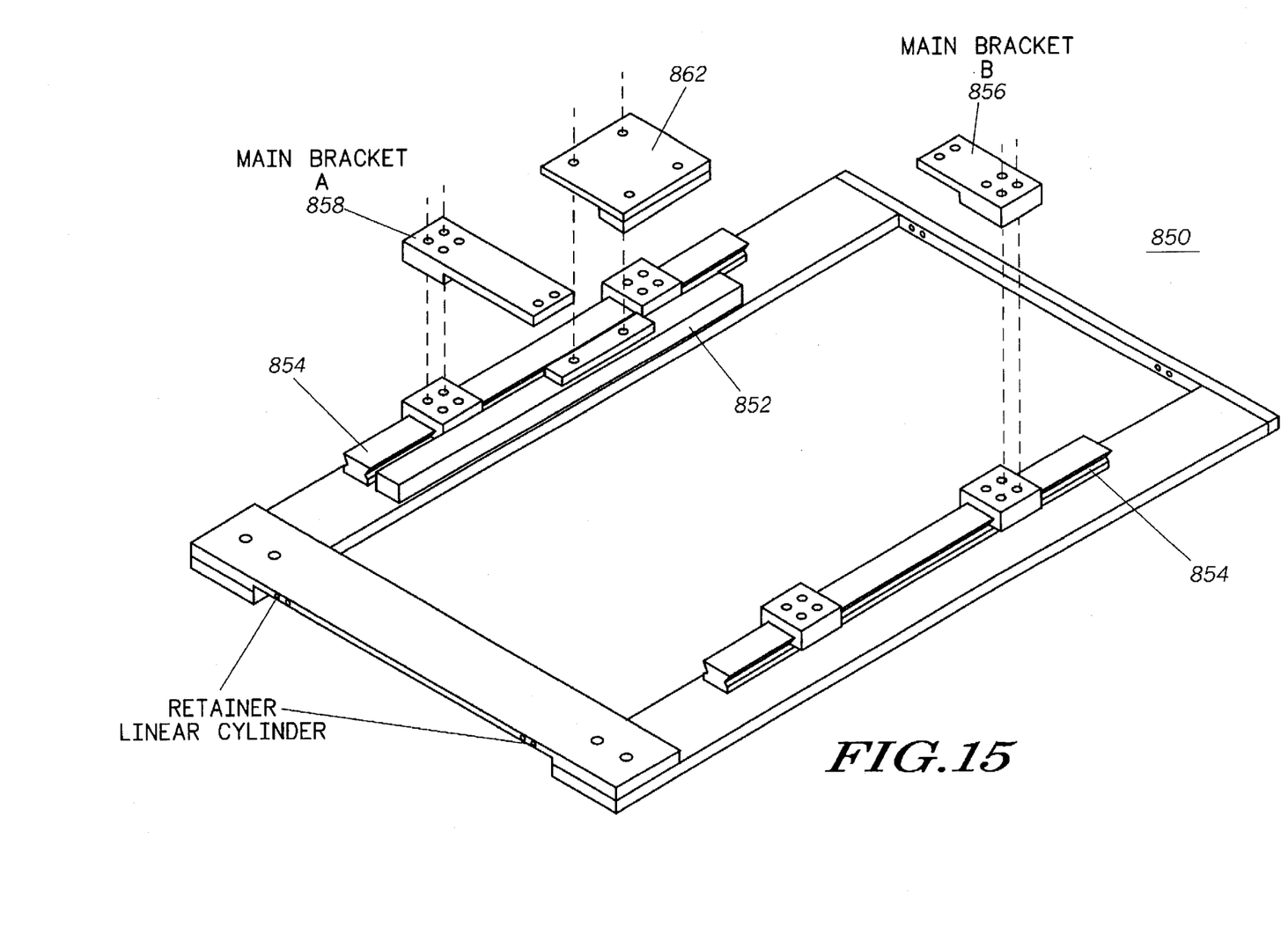
FIG. 15 is a perspective view of the master frame 850 of FIG. 13.
Figure 16:
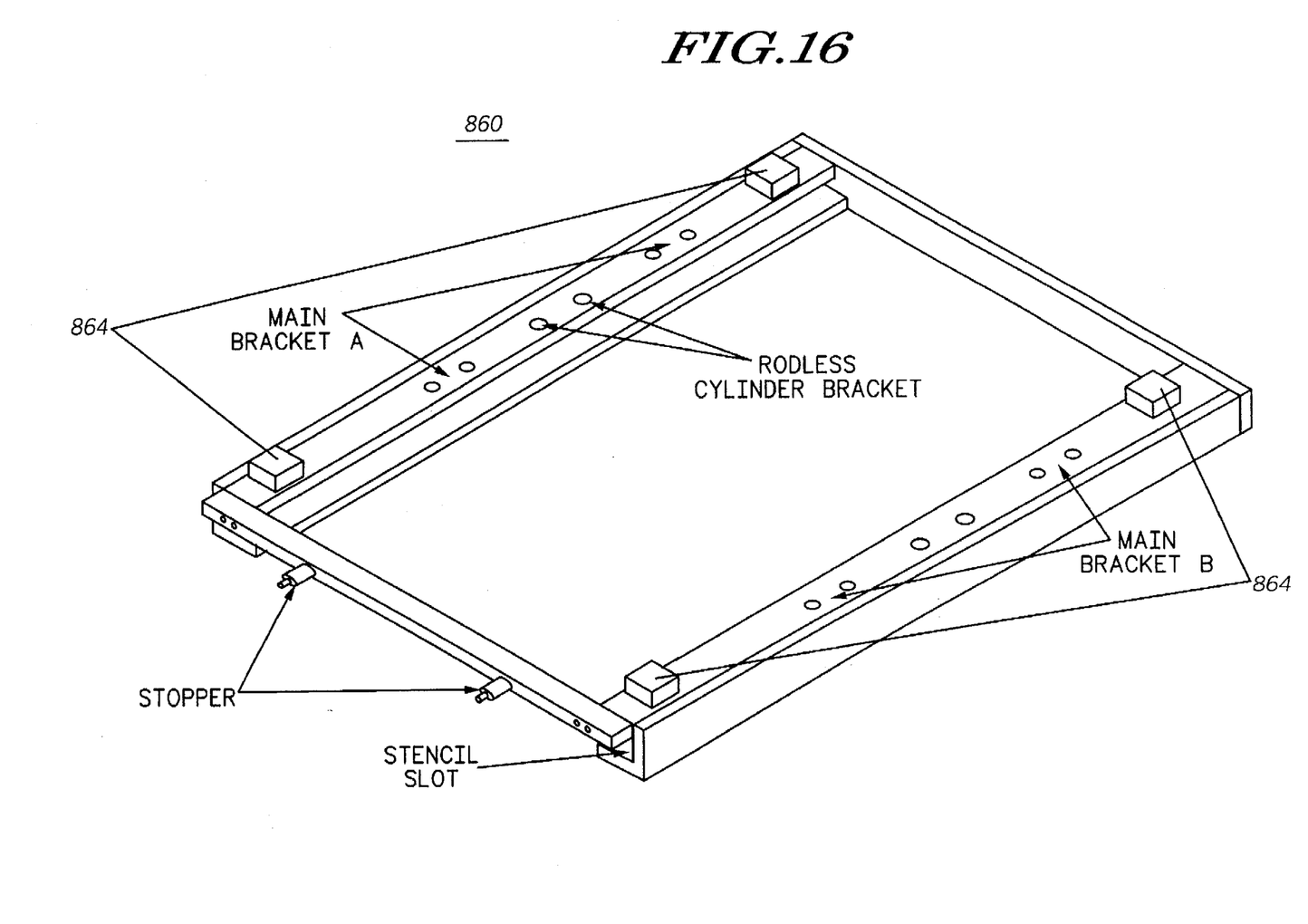
FIG. 16 is a perspective view of the stencil holder frame 860 of FIG. 13.
Figure 17:
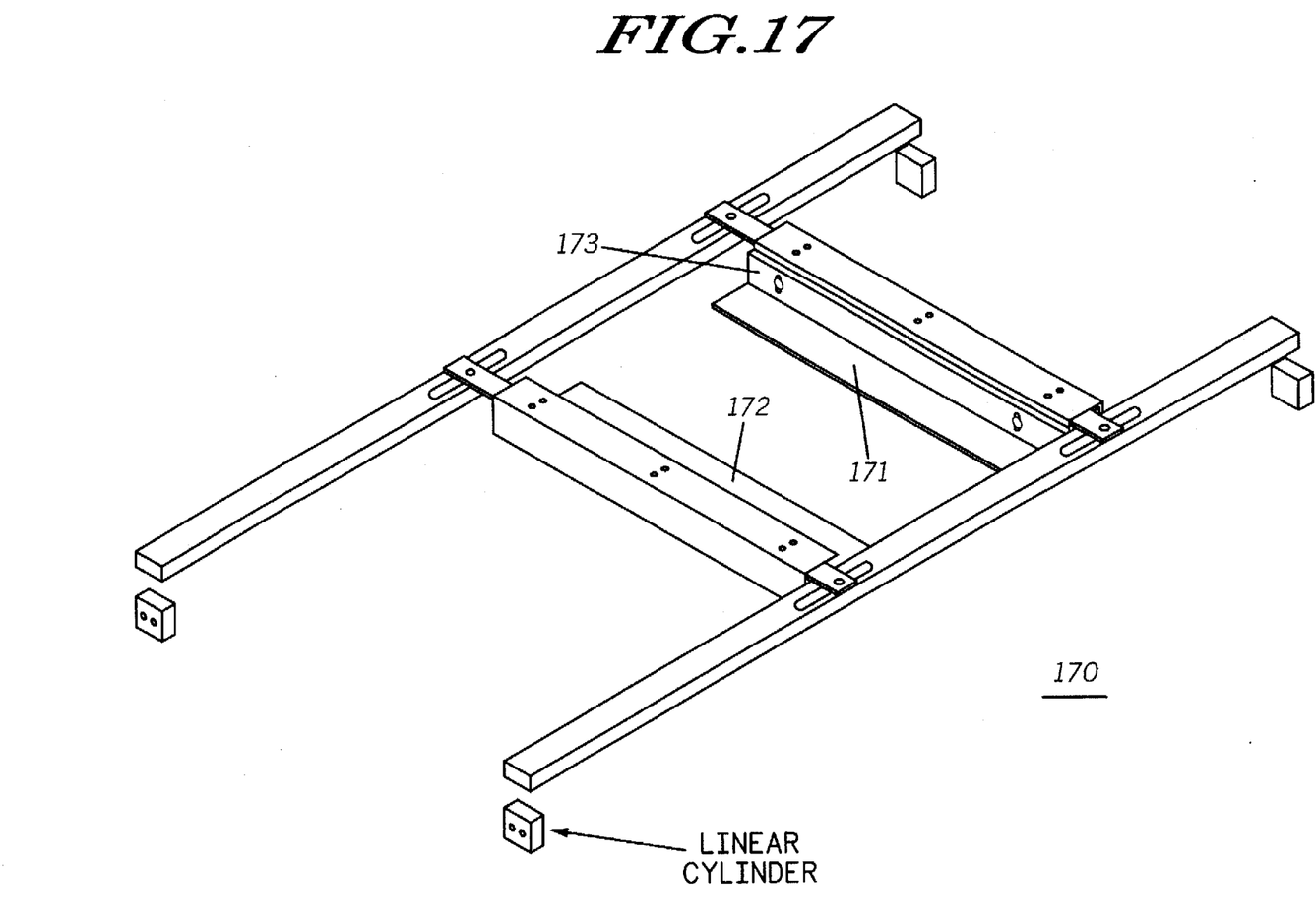
FIG. 17 is perspective view of the solder paste retainer 170 of FIG. 13.

Additionally, four linear motion cylinders 864 located on the stencil holder frame 860 are for clamping the stencil 814 in position. As is known in automatic pneumatic control systems, all the cylinders are connected to their respective pneumatic valves 866 which are controlled by a programmable logic controller 868.

Figure 19:
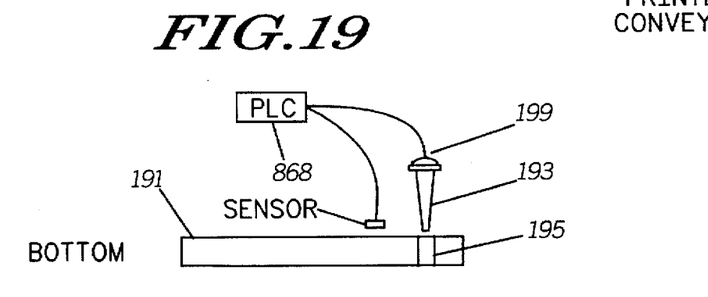
Figure 20:
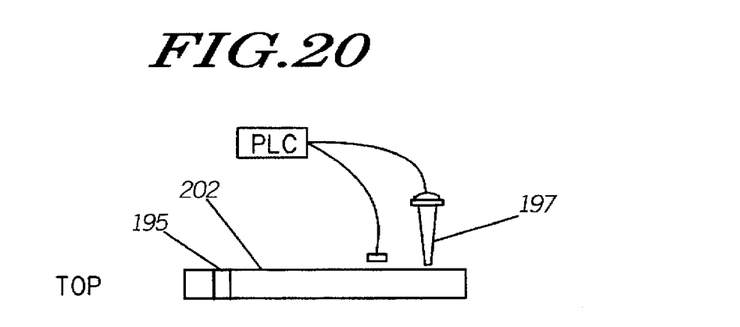

Referring to FIGS. 19 and 20, an optical sensor 193 that could be implemented with a camera determines what side the board is randomly facing in one of many possible ways. As one example, the optical sensor 193 provides a feedback signal 197 depending on whether the presence of a locating feature such as a tooling hole 195 on the board, representing the board's bottom side identification, is detected or not (199). The pneumatic motion controller, comprising the appropriately connected pneumatic valves 866 and the programmable logic controller 868, then shifts or not shift the stencil holder carriage frame in response to the feedback signal.

Optionally, the stencil shifter 800 includes a solder retainer 170 for preventing smearing of the solder paste around the area of concern. As implemented in FIG. 17, a suspended stationary pair of partitioning platforms 171 retain the solder in between the area surrounding one of the currently positioned sieves and not the other sieve. The retained solder can then be swept by one of the intermediate suspended squeegee blades across one of the sieves from one platform 171 to the other during the printing process.

Referring to FIGS. 18–27, one sequence of how to use the stencil shifter is illustrated. Originally, the HOME position of the stencil holder frame is at the rear side 811 which is the printing area of the bottom side 191 of the PC board.

Figure 18:
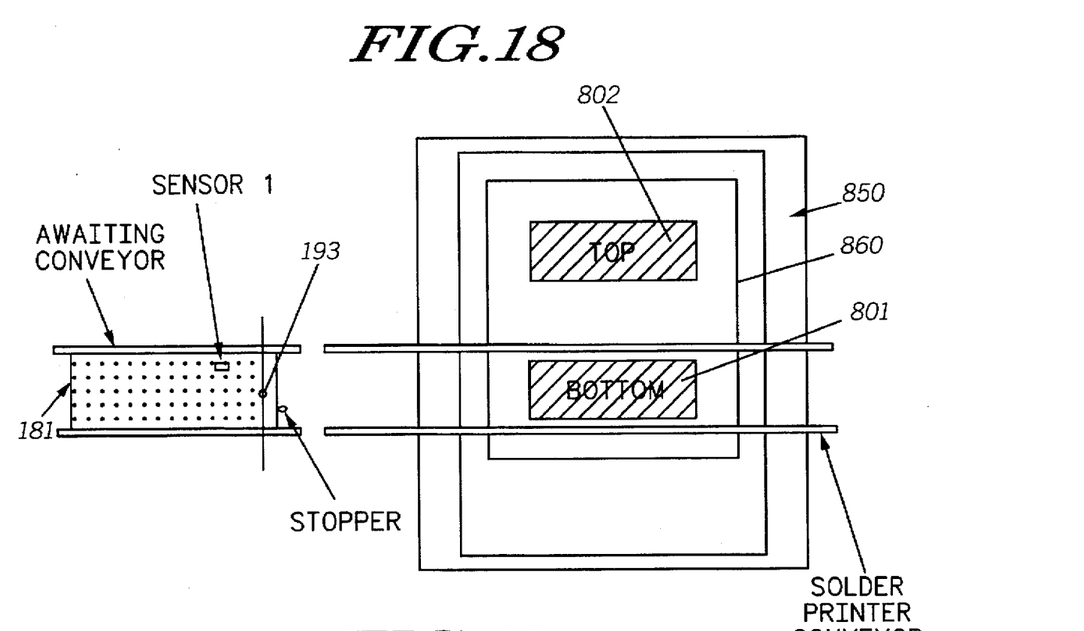
FIGS. 18–21 show a simplified representation of stencil shifting depending on the results of a board-side hole detection method, in accordance with the present invention.

Referring to FIGS. 18 and 19, the initial stage of the double-sided printing process is represented. Once the automatically controlled solder printer is engaged, before the board 181 enters the printer via the printer rail, a board side detection method is used on the board to differentiate between the top 195 and bottom side 191 of the PCB. In this exemplary board detection method, one hole 195 is designed and disposed on the PCB to denote the bottom board side 191. A camera or another type of optical sensor 193 is preferably used to detect the presence or absence of the hole and to provide a respective feedback signal 199 or 197 to the programmable logic controller 868 for responsive controlling of the shifter movement. For example, if the optical sensor 193 detects a hole 195 at a predefined location, than the bottom side 191 of the board is currently presented by the printer rail. Alternatively, if the detection by the sensor finds only the PCB 181 and no hole than the top side 202 of the board is present. If the first board at the waiting conveyor or printer rail is detected as bottom side 191, then there is no shifting employed and the board 181 just enters the printer for paste stenciling a solder mask pattern on the bottom side.

Figure 22:
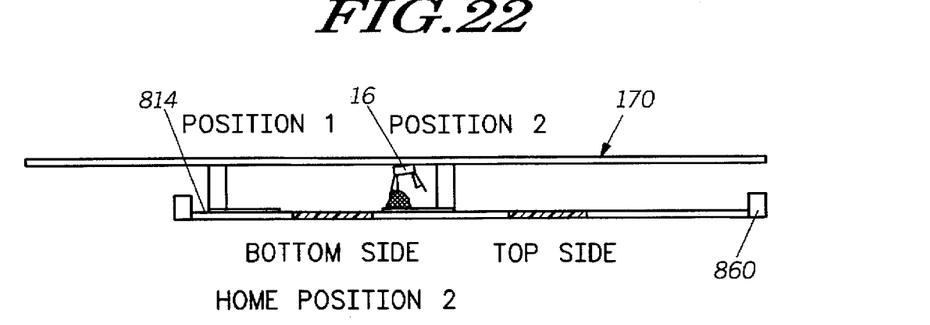
FIGS. 22–27 is a simplified representation of the two-stage top and bottom paste printing process using the stencil shifter assembly of FIG. 13, in accordance with the present invention.
Figure 23:
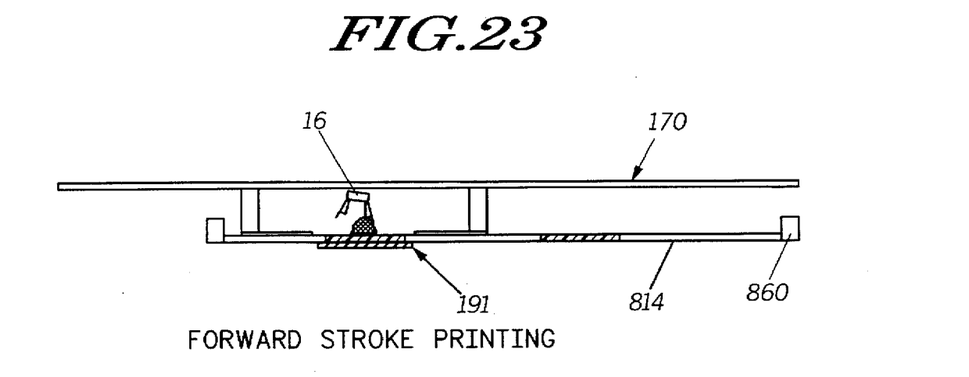
Figure 24:
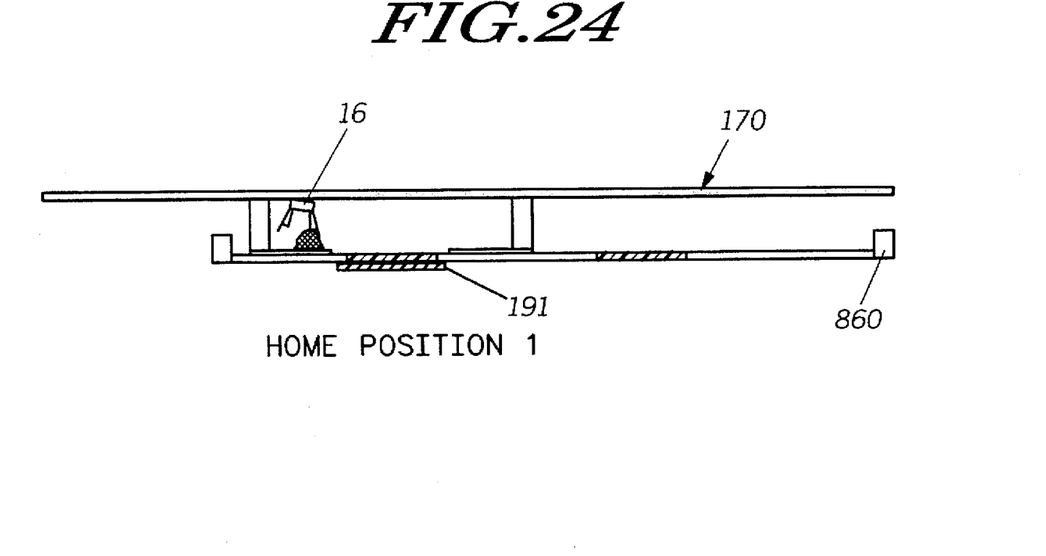

Referring to FIGS. 22–24, the bottom side printing process is carried-out. After the squeegee 16 prints the solder paste through the through-holes of the stencil, the squeegee will be moved from one side of the solder paste retainer to the other side of the retainer.

Figure 21:
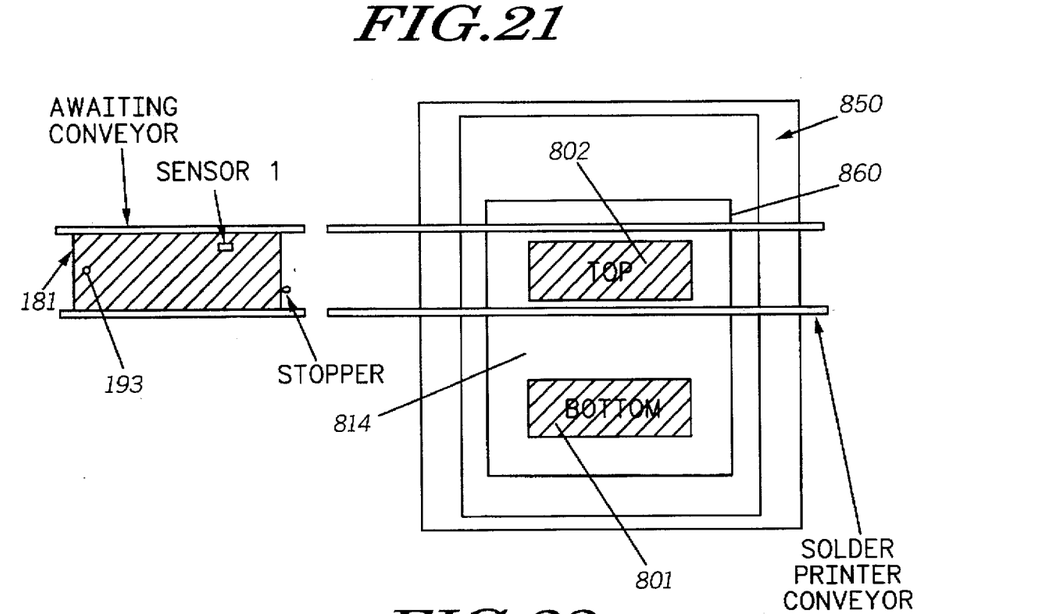

On the other hand, if the board is facing the top side as detected by the optical sensor 193 of FIGS. 20 and 21, then the stench holder frame 860 will shift the stencil 814 to its front side 822 by laterally moving the rodless cylinder.

Figure 25:
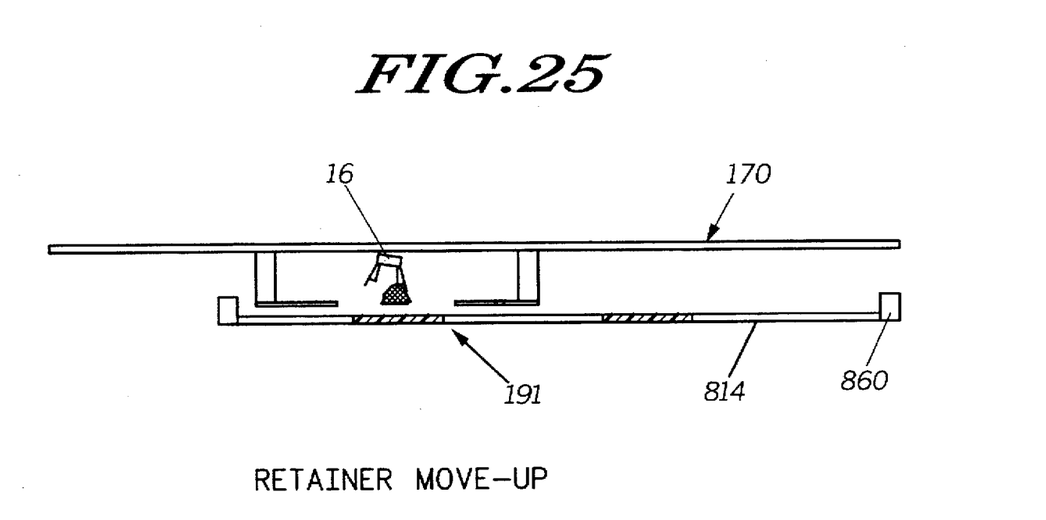
Figure 26:
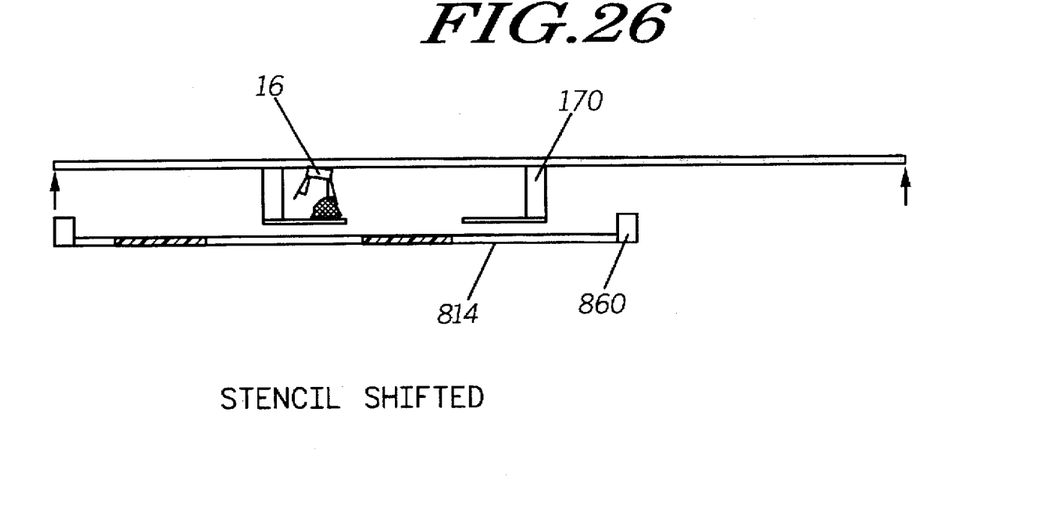
Figure 27:
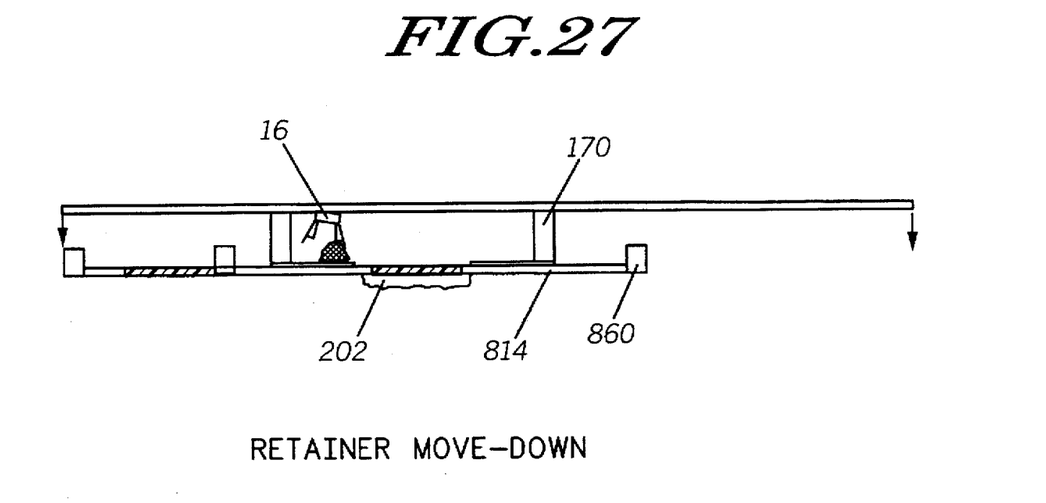

Referring to FIGS. 25–27, the retainer 170 will be preferably lifted up before the stencil holder frame 860 starts to shift in order to avoid friction between the stencil 814 surface and the retainer 170. Then the board is conveyed into the printing area by the printer rail and top-side printing is carried-out.

Preferably, after the stencil has been shifted out in this front position, it will remain here and not move back to the original rear location. Hence, when the next board facing the top side enters the printer, there will be no stencil shifting movement. But if the entering board faces the bottom side, the stench holder frame will shift back to its original HOME or rear position.

In summary, the inventive stencil shifter allows the automatic shifting of a stencil having a plurality of sieves to position the correct sieve opening depending on what is needed to be printed on the printed circuit board. Hence, machine capital and storage space is minimized by having a single printer be enabled to print both top and bottom sides of a double-sided board or to combine fine pitch and bigger component solder masking on one side of the board without any labor intensive manual change-over of the stencil.

What is claimed is:

1. A stencil shifter for a Surface Mount Technology printer for paste stenciling a first side of a board and a second side of a double-sided board, the shifter comprising:

a master frame providing a reference at its periphery;

a stencil holder carriage frame slidably mounted within the master frame and for holding an integral stencil having a plurality of sieves, the plurality of sieves including at least a first sieve for paste stenciling the first side of a board and a second sieve for paste stenciling the second side of the board;

an optical sensor for determining what side the board is randomly facing and providing a feedback signal; and a pneumatic motion controller for shifting the stencil holder carriage frame in response to the feedback signal.

2. The stencil shifter of claim 1, wherein the pneumatic motion controller comprises a rodless cylinder for slidably controlling linear motion of the stencil holder carriage frame within the master frame.

3. The stencil shifter of claim 1, wherein the optical sensor comprises a camera for detecting the presence of a hole on the board as the board's side identification.

4. The stencil shifter of claim 3 further comprising a pair of linear guide shafts mounted on the master frame for supporting the stencil holder carriage frame.

5. The stencil shifter of claim 3 wherein the pneumatic motion controller comprises a programmable logic controller controlling a plurality of pneumatic valves connected to the stencil holder carriage frame and the optical sensor.

* * * * *